(12) United States Patent
Hays

(10) Patent No.: US 8,571,615 B2
(45) Date of Patent: Oct. 29, 2013

(54) SUPERCONDUCTING METALLIC GLASS TRANSITION-EDGE-SENSORS

(75) Inventor: Charles C. Hays, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 106 days.

(21) Appl. No.: 13/230,653

(22) Filed: Sep. 12, 2011

(65) Prior Publication Data

US 2012/0065072 A1    Mar. 15, 2012

Related U.S. Application Data

(60) Provisional application No. 61/381,895, filed on Sep. 10, 2010.

(51) Int. Cl.
*H01L 39/00* (2006.01)
(52) U.S. Cl.
USPC ........................................... 505/191
(58) Field of Classification Search
USPC .............. 505/191, 330; 257/661–663; 427/62
See application file for complete search history.

(56) References Cited

U.S. PATENT DOCUMENTS

| | | | |
|---|---|---|---|
| 7,767,976 B2 * | 8/2010 | Allen et al. | 250/393 |
| 7,989,775 B2 * | 8/2011 | Allen et al. | 250/393 |
| 2004/0011960 A1 * | 1/2004 | Morooka et al. | 250/336.1 |
| 2007/0296953 A1 * | 12/2007 | Allen et al. | 356/28 |
| 2009/0278046 A1 * | 11/2009 | Allen et al. | 250/336.1 |
| 2011/0026614 A1 * | 2/2011 | Allen et al. | 375/259 |

OTHER PUBLICATIONS

Bauer et al., "Homogene mechanische Spannungen in aufgedampften Schichten", Zeitschrift Fur Physik, 220, 293-304 (1969).
V. Sushkov, "TES microcalorimeter readout via transformer", Nuc. Instr. and Methods in Physics Research a vol. 530, 234-250 (2004).
J.H. Mooij, "Electrical Conduction in Concentrated Disordered Transition Metal Alloys", Phys. Status Solidi A 17, 521-530 (1973).
Ullom et al., "Suppression of excess noise in Transition-Edge Sensors using magnetic field and geometry", Nuc. Instr. and Meth. A 520, 333-335 (2004).
Aslamazov et al., "The Influence of Fluctuation Pairing of Electrons on the Conductivity of Normal Metal", Phys. Letters 26A, No. 6, 238-239 (1968).
Chervenak et al., "Fabrication of transition edge sensor X-ray microcalorimeters for Constellation-X", Nuc. Instr. and Meth. A 520, 460-462 (2004).
Howson et al., "The Electron Transport Properties of Metallic Glasses", Physics Reports (Review Section of Physics Letters) 170, No. 5, 265-324 (1988).
Lindeman et al., "Characterization and reduction of noise in Mo/Au transition edge sensors", Nuc. Instr. and Meth. A 520, 348-350 (2004).
U. Mizutani, "Electronic Structure of Metallic Glasses", Prog. Mat. Sci. 28, 97-228 (1983).

(Continued)

*Primary Examiner* — Colleen Dunn
(74) *Attorney, Agent, or Firm* — Gates & Cooper LLP

(57) ABSTRACT

A superconducting metallic glass transition-edge sensor (MGTES) and a method for fabricating the MGTES are provided. A single-layer superconducting amorphous metal alloy is deposited on a substrate. The single-layer superconducting amorphous metal alloy is an absorber for the MGTES and is electrically connected to a circuit configured for readout and biasing to sense electromagnetic radiation.

23 Claims, 6 Drawing Sheets

(56) References Cited

OTHER PUBLICATIONS

Naugle et al., "Thickness Dependence of the Resistive Transition of Superconducting Films", Phys. Lett. 28A, No. 2, 110-111 (1968).

D.G. Naugle, "Electron Transport in Amorphous Metals", J. Phys. and Chem. of Solids 45, No. 4, 367-388 (1984).

Naugle et al., "Size Dependence of the Superconducting Transition Temperature", Phys. Lett. vol. 28A, No. 9, 611-612, 1969.

Samwer et al., "Amorphous superconducting ZrxCu1-x: Electronic properties, stability, and low-energy excitations", Phys. Rev. B vol. 26, No. 1, 107-123, 1982.

K.D. Irwin, "An application of electrothermal feedback for high resolution cryogenic particle detection", Appl. Phys. Lett. 66(15), 1998-2000, 1995.

Howson et al., "Localisation and interaction effects in the temperature and magnetic field dependence of the resistivity of metallic glasses", J. Phys., F: Met. Phys. 16, 989-1004, 1986.

Tenhover et al., "Superconductivity and the electronic structure of Zr- and Hf-based metallic glasses", Phys. Rev. B, vol. 27, No. 3, 1610-1618, 1982.

Lindeman et al., Performance of compact TES arrays with integrated high-fill-fraction X-ray6 absorbers, Nuc. Instr. and Meth. A 520, 411-413, 2004.

Karkut et al., "Upper critical fields and superconducting transition temperatures of some zirconium-base amorphous transition-metal alloys", Phys. Rev. B, vol. 28, No. 3, 1396-1418, 1983.

Lee et al., "Voltage-biased superconducting transition-edge bolometer with strong electrothermal feedback operated at 370 mK", Appl. Opt., vol. 37, No. 16, 3391-3397, 1998.

Johnson et al., "Effect of thermodynamic fluctuations on the shape and width of the resistive transition in threedimentional amorphous superconducting alloys", Phys. Rev. B, vol. 13, No. 11, 4827-4833, 1976.

Johnson et al., "Paraconductivity of three-dimensional amorphous superconductors-evidence for a short-wavelength cutoff in the fluctuation spectrum", Phys. Rev. B, vol. 17, No. 7, 2884-2891, 1978.

Altounian et al., "Superconductivity and spin fluctuations in M-Zr metallic glasses", Phys. Rev. B, vol. 27, No. 7, 4149-4156, 1983.

Mizutani et al., "Electronic properties of Cu-Ti metallic glasses", J. Phys. F: Met. Phys. 13, 2127-2136, 1983.

\* cited by examiner

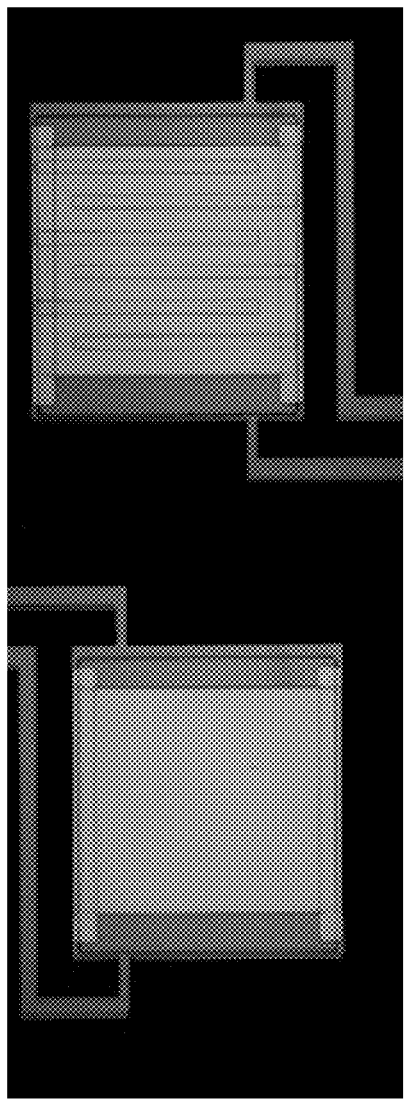
FIG. 1A
(PRIOR ART)
FIG. 1B
(PRIOR ART)
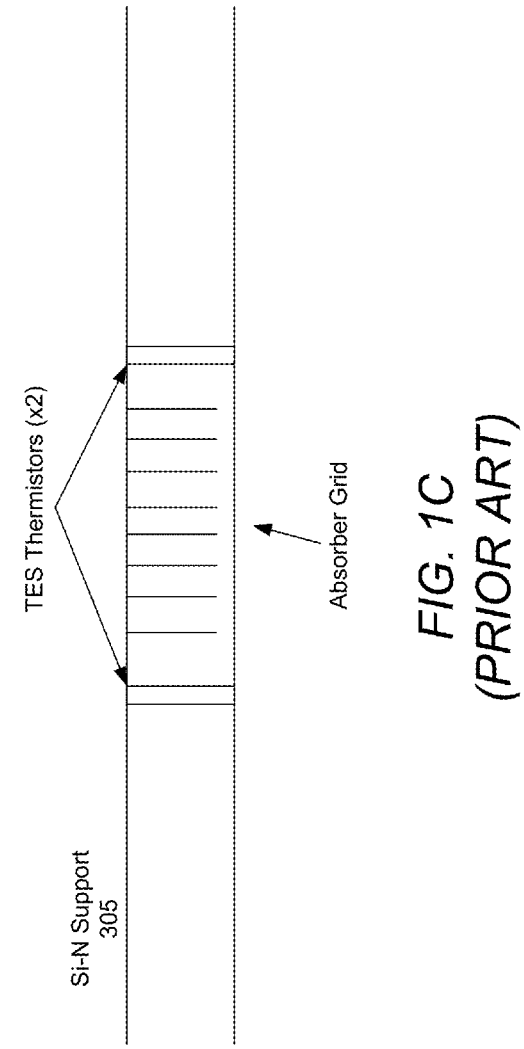
FIG. 1C
(PRIOR ART)

SUPERCONDUCTING METALLIC GLASS TRANSITION-EDGE-SENSORS

CROSS-REFERENCE TO RELATED APPLICATIONS

This application claims the benefit under 35 U.S.C. Section 119(e) of the following co-pending and commonly-assigned U.S. provisional patent application(s), which is/are incorporated by reference herein:

Provisional Application Ser. No. 61/381,895, filed on Sep. 10, 2010, by Charles C. Hays and Donald G. Naugle, entitled "Superconducting Metallic Glass Transition-Edge-Sensors,".

STATEMENT REGARDING FEDERALLY SPONSORED RESEARCH AND DEVELOPMENT

The invention described herein was made in the performance of work under NASA Contract Number NAS1-1407 and is subject to the provisions of Public Law 96-517 (35 USC 202) in which the Contractor has elected to retain title.

BACKGROUND OF THE INVENTION

1. Field of the Invention

The present invention relates generally to imaging, and in particular, to a method, apparatus, and article of manufacture for fabricating and using a metallic glass transition-edge-sensor (MGTES) device.

2. Description of the Related Art (Note: This application references a number of different publications as indicated throughout the specification by reference numbers enclosed in brackets, e.g., [x]. A list of these different publications ordered according to these reference numbers can be found below in the section entitled "References." Each of these publications is incorporated by reference herein.)

Actively cooled, direct radiation detectors, which exhibit improved image and energy resolution in the infra-red (IR) and x-ray wavelength regions, are a next-generation technology for advanced imaging, for both terrestrial and space applications. In this regard, NASA's Science Mission Directorate (SMD) is driven in part by the motivation for understanding the content and evolution of matter in the known universe. To support these goals, a broad spectrum of missions are planned to conduct measurements at submillimeter and far-infrared (FIR) wavelengths; e.g., the NASA proposed Background-Limited far-IR/Submillimeter Spectrograph (BLISS) and the SpicA FAR Infrared Instrument (SAFARI) instruments for Japan's Space Infrared Telescope for Cosmology and Astrophysics (SPICA) mission. SPICA requires actively cooled, direct radiation detectors, with very high sensitivity. Potential terrestrial applications for actively cooled, direct radiation detectors arrays are: 1) x-ray detectors for medical imaging; 2) chemical analysis for materials science (Scanning-electron-microscopy/Energy Dispersive Spectroscopy) at x-ray wavelengths; and 3) radiation detectors for nuclear forensics (e.g., Alpha-particle and gamma-ray detection).

Membrane-isolated superconducting transition-edge sensor (TES) arrays are a leading sensor technology for such space applications (see [1]-[3]). To meet application requirements, the detectors must be formatted into large-scale high pixel density arrays, which will be read using superconducting quantum interference detector (SQUID) Multiplexer (MUX) technology. Detector arrays that use the current baseline transition edge sensor technology, i.e., state-of-the art (SOA) TES arrays, do not exhibit the performance requirements of the BLISS instrument. The BLISS instrument requires detectors with the following performance metrics: 1) fast response time $\tau$ ($\tau$<100 mS); 2) high pixel density arrays (at least $10^3$ pixels); 3) TES films must exhibit stable $T_C$<100 mK; 4) must perform over a broad wavelength range 35 mm-433 mm; 5) low detector noise equivalent power (NEP) of the order NEP<$1 \times 10^{-19}$ W/$\sqrt{Hz}$; and 6) low 1/f noise level at low frequencies, f, below 10 Hz.

TES-based microcalorimeter arrays are being developed for the mission listed above, as well as the NASA Beyond Einstein Program Constellation-X Observatory (Con-X, for measurements of x-ray spectra). SOA TES devices detect radiation by precisely measuring the temperature rise associated with the absorption of a photon, which raises the TES temperature. The temperature increase is detected by a superconducting thermistor, which is voltage-biased 10-20% into the superconducting transition curve at $T=T_C$. The superconducting thermistors in SOA TES devices are typically based on: 1) elemental superconducting films; e.g., Titanium (Ti, $T_C$=565 mK) or Iridium (Ir, $T_C$=130 mK); and 2) proximity effect elemental metallic bilayer design; e.g., Mo/Au. FIGS. 1A and 1B illustrate an ordinary bilayer Mo/Au (Molybdenum/Gold) TES (FIG. 1A) and TES with stripes (FIG. 1B) (140 microns on a side, stripes spaced every 15 μm) of the prior art. In the single-layer elemental TES designs, the superconducting transition temperature $T_C$ cannot be controlled, and is well above the desired operating temperature (~50 mK) for space applications. The bilayer TES device functions as a single superconducting element via the proximity effect, and the superconducting transition temperature, $T_C$, is controlled by the thickness of the superconductive film element. However, this TES device architecture has inherent problems, which are manifest in fabrication difficulties, control of the superconducting transition temperature, $T_C$, and an excess noise equivalent power spectrum.

In other words, while the techniques used to fabricate SOA TES single-layer elemental and TES bilayer designs are well developed, the TES device architecture exhibits a variety of problems: 1) device fabrication is difficult to control, resulting in variable superconducting transition temperature, $T_c$, from element to element; 2) broadened transition widths, $\Delta T_C$~2-30 mK; and 3) SOA TES devices exhibit an excess noise equivalent power spectrum (NEP) (see [4]-[5]).

SOA TES devices based on the bi-layer design are designed for operation at ~50 mK, and the individual TES films must exhibit similar $T_c$ values for good performance. In SOA TES devices, the $T_c$ values are difficult to control because these devices are fabricated using thin-film synthesis techniques based on geometry. Achieving the control necessary to fabricate large arrays is technically challenging, as the $T_C$ is a sensitive function of the properties of both layers, as well as the interface transparency. In Mo/Au proximity effect bilayer TES designs, the lack of control of the residual resistance ratio (RRR) for as-sputtered Au films impacts the $T_c$ value, and post-annealing to improve the RRR contribute to un-controlled changes in $T_c$.

The e-beam deposition techniques used to fabricate bilayer TES devices are also manifest with challenges. Typically, Mo/Au films are e-beam deposited onto an LSN (low-stress silicon nitride) substrate maintained at 600° C.; the high substrate temperature is used to compensate for thermal expansion coefficient mismatch between the metal film and substrate. The remaining residual stress in these Mo-films is of the order 400 to 600 MPa (Megapascals). In these films, the residual stress shifted the superconducting transition temperature $T_c$ by as much as 50 mK.

SOA single-layer elemental design TES detectors; e.g., based on Ti or Ir, typically exhibit an excess noise-equivalent-power (NEP), which is 2× larger (or greater) than that predicted by theory. SOA bilayer design TES detectors typically exhibit an NEP which is 4-10× greater than that predicted by theory. FIG. 2 illustrates excess noise in bilayer TES compared to the calculated Johnson noise of the TES and shunt resistor in the prior art. The source of this noise is unknown. Resolution of the excess noise is a global challenge for everyone in the field.

In the SOA designs, there are factors intrinsic to their design, which may limit the reduction of the excess noise spectrum to acceptable levels. For example, in Mo/Au proximity effect bilayer TES designs, the residual stress state in the bilayers has ramifications on the excess noise exhibited by these films. Local fluctuations in the film stress state, on spatial length scales of the order of the superconducting coherence length ξ can increase quasiparticle carrier scattering in the metallic layer, which can introduce additional noise. Defects present in the elemental crystalline films (e.g., grain boundaries and dislocations) contribute to an increase in quasi-particle charge carrier scattering at low temperatures, thereby increasing the noise levels observed. Interlayer quasiparticle carrier scattering in metallic bilayers will also introduce additional noise.

In addition to the technical challenges outlined above, another issue that limits the application of TES devices for terrestrial applications, is the low TES operating temperature, $T_{op}$~100 mK. To actively cool TES arrays to this temperature range, complex and costly cryogenic cooling methods (e.g., dilution refrigerators) are required. A TES technology that would enable operation at 0.3 K or higher, would be very desirable, as this temperature can be achieved using closed-cycle refrigerator systems using $^3$He or the newer adiabatic demagnetization refrigerator (ADR) system (e.g., a continuous adiabatic demagnetization refrigerator (ADR with 4-stages), a He$^3$/He$^4$ dilution refrigerator, or a cryogenic cooling system that uses liquid $^4$He).

The performance limiting difficulties associated with the SOA TES devices are:
  $T_c$ controlled only by superconducting proximity effect in metallic bilayer design and for these ultra-thin films the substrate surface roughness broadens the transition; therefore $T_c$ value is difficult to control;
  Energy resolution limited by low logarithmic sensitivity factor (α) values, manifest by large transition widths, $\Delta T_c$;
  Large excess noise values at high frequencies [1-20 kHz] (up to 20 times theoretical expectations), correspondingly reduces the high-frequency sensitivity;
  Sources of large excess noise are unknown;
  Fabrication techniques introduce wide variability in TES performance values;
  SOA TES design itself introduces unavoidable extrinsic sources of excess noise; and
  Expensive cryogenic technology required to achieve cooling to ~100 mK.

SUMMARY OF THE INVENTION

As described above, prior art TES detectors include many limitations including:
  $T_C$ value difficult to manage;
  Large excess high-frequency noise (often 2-10 times theoretical expectation) of unknown origin;
  Complex fabrication process; difficult to reproduce for large arrays; and
  Fabrication process introduces large residual stresses in bilayer films.

Embodiments of the invention provide a new type of transition edge sensor that will meet the requirements for many terrestrial (e.g., spectroscopy) and space-based sensing applications in the IR and X-ray wavelength regions. The novel devices are based on single-layer thin-films of superconducting amorphous metal alloys—i.e., metallic glasses. Changes in chemical composition are used to control the $T_c$ in amorphous metal alloys, in thin-film form. Superconducting metallic glass forming alloys with $T_c$ values as high as 7.6 K have been reported (see [6]-[7]), and a number of systems exhibit $T_c$'s near 300 mK (e.g., $Zr_{40}Cu_{60}$) (see [8]). In addition, superconducting metallic glasses typically exhibit very narrow transition widths $\Delta T_c$~0.1-10 mK. For example, Johnson et at report that a splat-quenched $Zr_{75}Rh_{25}$ metallic glass foil (45 μm thick) exhibits a superconducting transition at $T_c$=4.562 K, and a transition width, $\Delta T_c$=7 mK, defined by the 10% and 90% points on the resistive transition curve (see [6]-[7]).

Therefore MGTES devices in accordance with embodiments of the invention can be operated at higher temperatures than conventional TES devices. Temperatures in this range are achieved using closed-cycle cryogenic systems that use $^3$He, resulting in an immediate decrease in overall operating cost for this type of cryogenically cooled detector array. In addition, the active element of MGTES device embodiments may be comprised of a single-layer alloy film, greatly simplifying the fabrication methodology used to fabricate a large array of MGTES devices. Further, intrinsic features associated with the disordered alloys used in MGTES device embodiments contribute to a significant reduction in the NEP values, and with an improved energy resolution. MGTES devices will be subject to lower 1/f noise values due to their narrow superconducting transition temperature widths, which will minimize the bias-induced noise. All of these benefits extend to terrestrial applications operating at higher temperatures (T>100 mK).

BRIEF DESCRIPTION OF THE DRAWINGS

Referring now to the drawings in which like reference numbers represent corresponding parts throughout:

FIGS. 1A and 1B illustrate an ordinary Mo/Au (Molybdenum/Gold) TES (FIG. 1A), TES with stripes (FIG. 1B) (140 microns on a side, stripes spaced every 15 μm) and grating-style absorber for Far-Infrared Radiation Far-IR or Sub-mm Spectroscopy (FIG. 1C) of the prior art;

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Superconducting metallic glasses exhibit a number of desirable properties for applications of embodiments of the invention, and will exceed the performance of the SOA for each TES figure of merit:

Improved energy resolution;
Lower excess noise;
Amorphous alloy may be a self-absorber of radiation (with 4d and 5d transition metal additions to alloy(s));
Precisely controlled superconducting transition temperature, $T_c$;
Simplified detector architecture; and
Mechanically & chemically robust design.

Some of these advantages are detailed in Table 1:

TABLE 1

Comparison of performance of MGTES vs. State-of-the-Art.

| TES Figure of Merit | Current SOA (bilayer geometry) | MGTES (Superconducting amorphous metal thin film) | Improvement MGTES vs. SOA |
|---|---|---|---|
| Control of $T_C$ | Difficult to control by film thickness | Composition controls $T_C$: $Cu_{35}Ti_{65}$ (At. %) – $T_C = 58$ mK $Cu_{60}Zr_{40}$ (At. %) – $T_C = 320$ mK | Enabling feature in amorphous alloys |
| Intrinsic noise: 1/f, thermal fluctuations & Johnson | Quasiparticles scattered by grain boundaries, crystal defects | Quasiparticles in superconducting metallic glass thin-films are not scattered from grain boundaries or other crystalline defects below $T_c$. | Noise will be near fundamental limit |
| Excess NEP | Source unknown: 2X-10X larger than theoretical expectation | In glassy metal films, noise levels are reduced by homogeneity of single layer film | Large reductions possible |
| Device Fabrication | metallic bilayer design difficult to synthesize for very thin films | Single layer thin film thermistor easily fabricated, lead structures can be made from same alloy system; w/higher $T_C$ | Enabling features |

Basic MGTES Architecture

Figure 2:
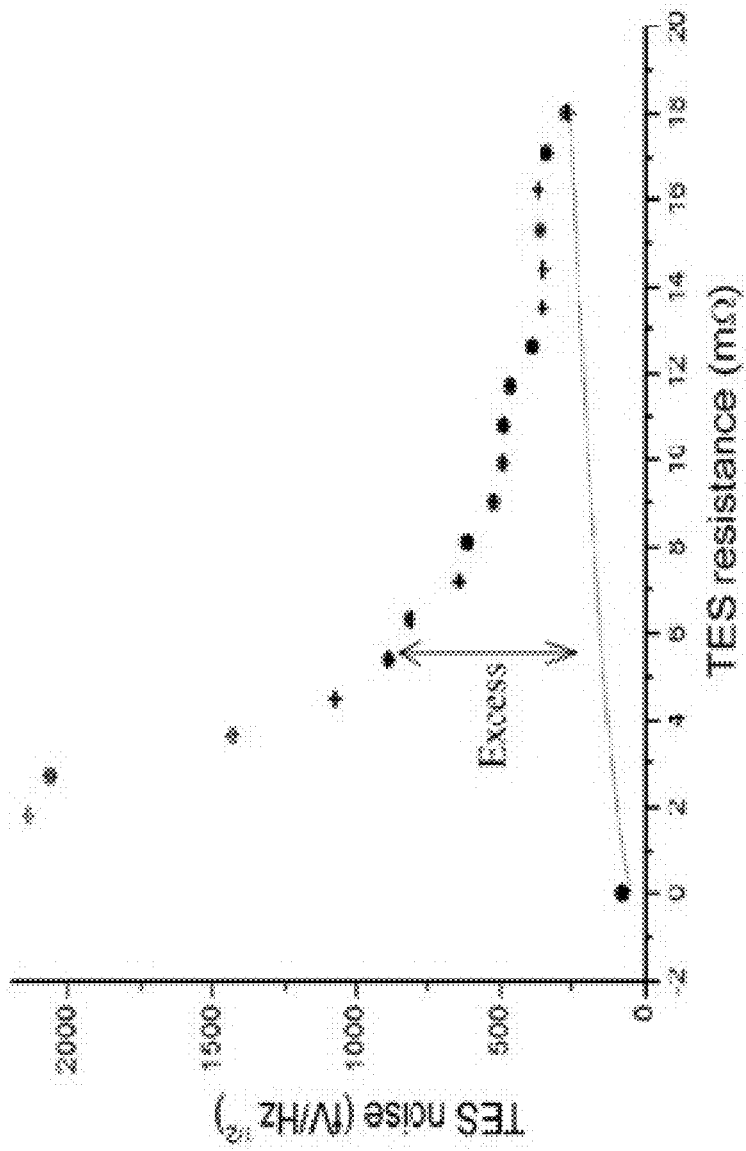
FIG. 2 illustrates excess noise in bilayer TES compared to the calculated Johnson noise of the TES and shunt resistor in the prior art.
Figure 3:
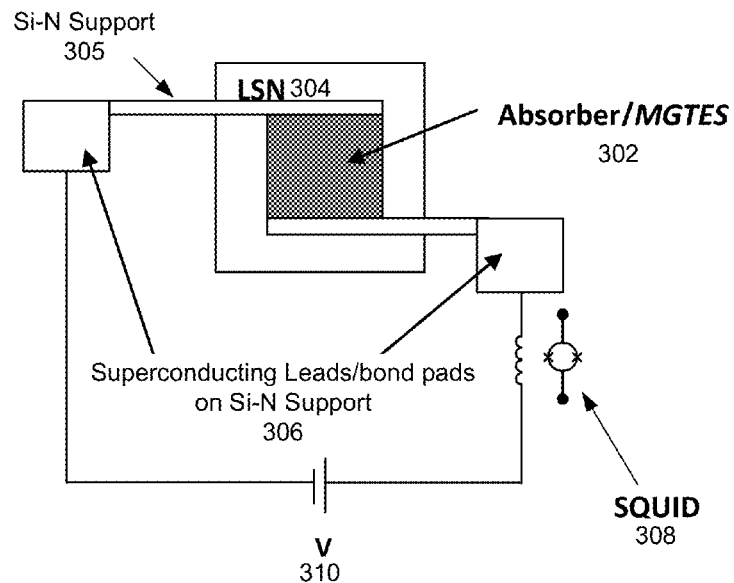
FIG. 3 illustrates a schematic of a MGTES device architecture in accordance with one or more embodiments of the invention.

To illustrate the design advantages of MGTES detectors in accordance with embodiments of the invention, the application of the MGTES detectors as x-ray radiation and infrared radiation (IR) detectors is described herein. For IR sensing, the device design would be very similar, except without the addition of an x-ray absorbing layer on the TES thermistor. In either case, each MGTES device may be run in the deep Electro-Thermal-Feedback (ETF) mode (see [1]). The MGTES detector arrays operate as micro-calorimeters, and are scalable to large arrays. The MGTES pixels are read out using superconducting quantum interference (SQUID) amplifiers. Based on MGTES design details, SQUID multiplexing techniques based on transformer ratio multiplexing can be explored (see [9]). As a starting point, for a discussion of MGTES alloys, the device architecture shown in FIG. 3 is presented, which is similar to that employed in SOA TES arrays. Consequently, FIG. 3 illustrates a schematic of a MGTES device architecture in accordance with one or more embodiments of the invention.

An MGTES element 302 can be synthesized as a 140 μm×140 μm sized device, on a Low-Stress-Silicon-Nitride (LSN) substrate 304 of varying thickness (0.25 μm<$T_{LSN}$<1 μm). To tune the thermal conductance G, membrane-isolated TES sensor designs are used, wherein the superconducting film 302 is deposited onto a thin Silicon-Nitride (Si—N) membrane 304, which is thermally isolated by thin Si—N support beams 305 of low thermal conductance. The MGTES design has an advantage in that its superconducting leads 306 can be deposited using higher transition temperature compositions from the same alloy system as the TES element itself.

Shown in FIG. 3 is the SQUID 308 current readout, whose output is used in feedback to the bias voltage 310 to maintain the operating point (10%-20% bias point) on the MGTES transition curve.

Superconducting metallic glass transition-edge sensors (MGTES) 302 can be fabricated using a single-layer glassy (amorphous) superconductive thin film as the active device element, which is overall a much simpler device architecture compared to the SOA multilayer TES designs. The simplified architecture greatly increases the ability to fabricate large arrays of MGTES detectors 302, with minimal variation in $T_c$, from one element to another. MGTES films may be deposited onto substrates held at or near room temperature, which greatly improves device yield compared to the SOA proximity effect TES devices, where the substrate temperatures are raised to 600-700° C. during the deposition process. MGTES films deposited onto substrates held between 77-300 K would exhibit very uniform amorphous structures for good glass forming alloys.

MGTES Alloys

The superconducting metallic glass transition-edge sensors (MGTES) introduce the novel concept of using film chemistry modulations alone to control the transition temperature $T_c$. This well-studied technique offers the possibility of smoothly tuning the superconducting transition temperature of the MGTES device, while also adjusting its composition for high physical and chemical stability.

The energy resolution limit of the TES device (including Johnson noise in the film and the thermodynamic fluctuations between the detector and the heat bath) is given by reference [1]:

$$\Delta E_{FWHM} = \sqrt{k_B T^2 C (1/\alpha) \sqrt{8n}} \qquad \text{Eqn. -1}$$

where C is the total heat capacity of the superconducting thin film and absorber. The factor n=d log P/d log T is the logarithmic derivative of the bias power with respect to temperature, typically, n=3-5. In Eqn.-1, $\alpha$ is the logarithmic sensitivity factor $$\alpha = \frac{d\log R(T)}{d\log T} = \left(\frac{T}{R}\right)\left[\frac{dR}{dT}\right] \qquad \text{Eqn. -2}$$

The $\alpha$ value in SOA TES devices based on polycrystalline films is typically 20<$\alpha$<200. The $\alpha$ value is a measure of the sharpness of the superconducting transition, and it is strongly dependent on the properties and the state of the film. The $\alpha$ values in SOA TES devices are reduced, manifest by the complexity of the elemental metallic bilayer design, which results in a broadened transition widths of the order $\Delta T_c$~2-30 mK.

The MGTES may exhibit a significantly improved energy resolution, because amorphous superconducting films can be fabricated with very narrow transition widths, as low as $\Delta T_c \approx 100$ μK. Further, such transition widths may only be limited by intrinsic superconducting fluctuations. Due to the findings presented in numerous studies, it is accepted that for amorphous superconductors, the contribution to the transition width $\Delta T_c$ from superconducting fluctuations is well described using the Aslamazov-Larkin (AL) theory. As a means of estimating the performance of MGTES devices, the contribution to the transition width $\Delta T$ may be calculated using the Aslamazov-Larkin (AL) theory for superconducting fluctuations (see [10]). AL fluctuations contribute to broadening of the transition width, and are dominant near the lower end of the transition, i.e., near the zero in resistance.

$$\Delta T_c/T_c = 1.52 \times 10^{-5} \cdot R_\square(\Omega) \qquad \text{Eqn.-3}$$

Figure 4:
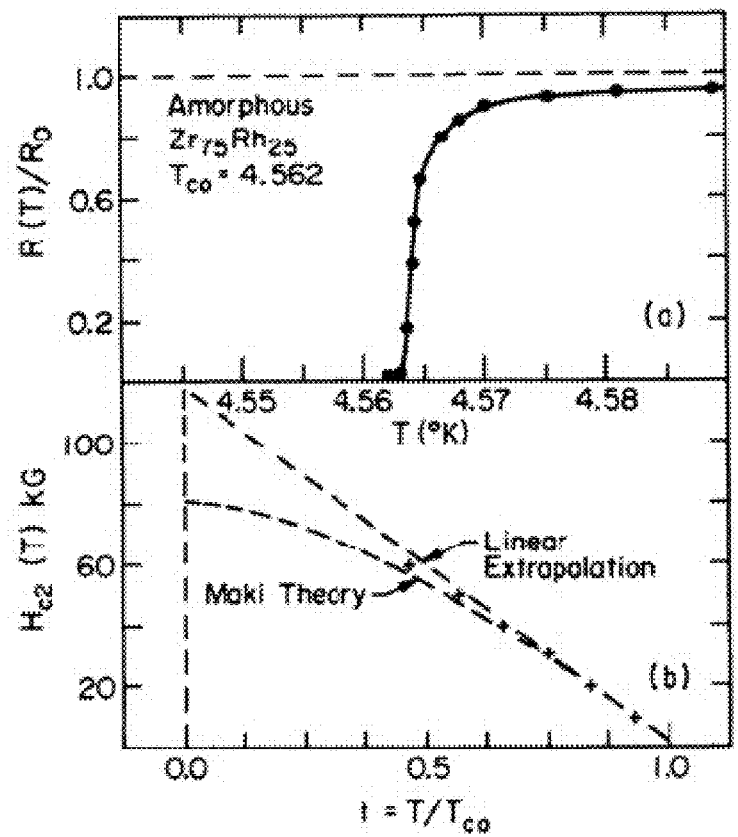
FIG. 4 shows the superconducting transition observed in an amorphous $Zr_{75}Rh_{25}$ (At. %) splat-quenched foil in accordance with one or more embodiments of the invention.

The resistance per square $R_\square(\Omega)$ was calculated from data presented in Ref. [11] by using its definition $$R_\square(\Omega) = \frac{\rho}{t} \qquad \text{Eqn. -4}$$

where $\rho$ is the film resistivity in $\Omega$-m, and t is the film thickness in meters. Narrow superconductive transition widths $\Delta T_c$ predicted by Eqn. 3 & 4 above are somewhat universal to superconducting amorphous thin films. FIG. 4 shows the superconducting transition observed in an amorphous $Zr_{75}Rh_{25}$ (At. %) splat-quenched foil (e.g., of Ref. [7]) in accordance with one or more embodiments of the invention. The Zr—Rh and Zr—Cu alloys are model systems, and therefore are relevant for a discussion of the magnitude of superconductive fluctuations near $T_c$.

To estimate the performance of an MGTES device fabricated from amorphous $Zr_{75}Rh_{25}$ and $Zr_{40}Cu_{60}$ films, the AL theory is applied to calculate the superconductive transition width $\Delta T_c$. The results of these estimates are provided in Table 2.

TABLE 2

| Alloy Composition | $\rho$ ($\Omega$-m) | t (Å) | $T_c$ (K) | $R_\square$ ($\Omega$) | Calculated $\Delta T_c(K)$ | Calculated $\alpha$ |
|---|---|---|---|---|---|---|
| $Zr_{75}Rh_{25}$ | 220e-8 | 1000 | 4.56 | 22.0 | 1.53e-3 | 2980 |
| $Zr_{40}Cu_{60}$ | 163e-8 | 1000 | 0.3 | 16.3 | 0.24e-3 | 1250 |

In Table 2, the Aslamazov-Larkin theory is applied to calculate the transition width $\Delta T_c$ and the calculated logarithmic sensitivity factor $\alpha$ in $Zr_{75}Rh_{25}$ and $Zr_{40}Cu_{60}$ films.

As described above, narrow transition widths $\Delta T_C$ are somewhat universal to superconducting amorphous thin films. The electron transport and superconductive properties of amorphous metals are reported in reviews by Mizutani, Howson & Gallagher, and Naugle (see [20]-[22]). Reports of superconductive behavior at low temperatures, $T_C < 1$ K, in two alloy systems: $Cu_{35}Ti_{65}$ ($T_C = 58$ mK) and $Cu_{60}Zr_{40}$ ($T_C = 320$ mK) are useful. Based upon such alloys, a number of alloy compositions, with ternary additions, may exhibit $T_C$'s in the range $T_C \approx 65$-75 mK.

The alloys in both of these systems are strongly scattering metallic glasses (i.e., amorphous metals), where the conduction is due to the d-band conduction. Such alloys exhibit a negative temperature coefficient of resistivity $\alpha_r < 0$, with resistivity values that are well above the Mooij correlation limit $\rho \approx 150$ μΩ-cm (see [12]). For alloys with resistivities above this limit, the temperature dependence, $\rho(T)$, is small and can be tuned via composition.

Using the calculated superconductive transition width, the logarithmic sensitivity factor $\alpha$ can also be estimated (and is included in Table 2 above):

$$\alpha = \frac{d\log R(T)}{d\log T} \approx \left(\frac{T_c}{R}\right)\left[\frac{\Delta R}{\Delta T_c}\right]$$

The predicted superconductive transition widths are $\Delta T_c = 1.53$ mK and $\Delta T_c = 0.24$ mK, for $Zr_{75}Rh_{25}$ and $Zr_{40}Cu_{60}$, respectively. $\Delta T_c$'s of this magnitude provide large logarithmic sensitivity factors, and the calculated results are promising. The estimated AL fluctuation spectrum contribution to $\Delta T_c = 1.53$ mK for $Zr_{75}Rh_{25}$, is especially promising: 1) for the qualitative agreement with the experimentally determined $\Delta T_c = 7$ mK value for a 45 μm thick foil; and 2) the large $T_c$, which suggests the fabrication of MGTES arrays operating at higher temperatures. Temperatures in this range, ~4 K, are commercially viable for medical imaging applications.

The calculated logarithmic sensitivity factors are much greater than the known values for the SOA proximity effect bilayer TES devices. In calculating $\alpha$ for the amorphous superconductors, it may be assumed that $\Delta R/R \approx 1$. This is reasonable for low bias points on the $Zr_{75}Rh_{25}$ and $Zr_{40}Cu_{60}$ transition curves. These alloys are strongly scattering metallic glass, where the conduction is due to the d-band conduction (see [11]). This alloy exhibits a negative temperature coefficient of resistivity $\alpha_r < 0$, with resistivity values well above the Mooij correlation limit $\approx 150$ μΩ-cm (see [12]). For alloys with resistivities above this limit, the temperature dependence, $\rho(T)$, is small and can be tuned via composition.

Figure 5:
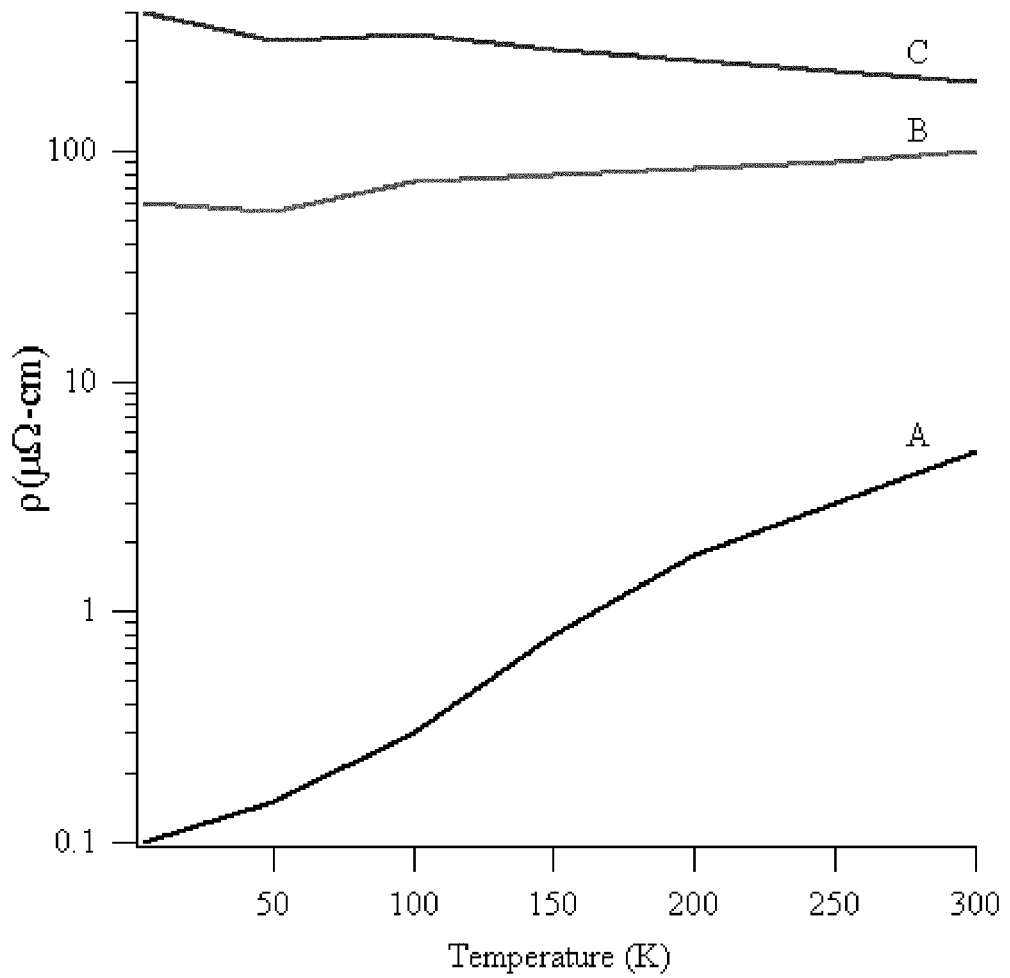
FIG. 5 illustrates the temperature dependence of resistivity curves for: A) crystalline metals, B) weakly-scattering metallic glasses, and C) strongly-scattering metallic glasses in accordance with one or more embodiments of the invention.

The temperature dependence of resistivity curves for: A) crystalline metals, B) weakly-scattering metallic glasses, and C) strongly-scattering metallic glasses, are shown in FIG. 5 in accordance with one or more embodiments of the invention. In other words, FIG. 5 illustrates the schematic temperature dependence of the electrical resistivity, $\rho_e$, for: A) crystalline metals, B) weakly-scattering metallic glasses, and C) strongly-scattering metallic glasses. In the strongly scattering alloys of the type C, at low temperatures quantum corrections to the temperature dependence of resistivity become important in the weak-localization regime (WLR). In the WLR, the electron propagation between scattering events is no longer classical as there is significant interference between scattered partial waves. There are two sources of correction; (a) the 'localization' effect, which considers the quantum interference effects and (b) the 'interaction' effect, which considers the modification of the $e^-$-$e^-$ interaction in the WLR. These ideas have been very successful in describing the behavior in various examples of disordered metals and they represent a fundamental difference between the transport properties of highly resistive metals and metals for which $\rho < 100$ μΩ-cm. In amorphous metals, the disordered structure is the primary electron scattering mechanism, so impurities and defects have little effect on the properties. Therefore, the Residual-Resistance-Ratio (RRR)=R(300 K)/R(4.2 K) for an MGTES device (in accordance with embodiments of the invention) may be of the order RRR$\approx$1. Such an embodiment reduces the effects of film non-uniformities, providing narrow transitions.

Amorphous superconductors have no long-range order, and so they show no anisotropy effects, Brillouin-zone effects or precipitation effects. Obviously, they also lack crystal interfaces (grain boundaries) and crystalline imperfections (dislocations, twins, stacking faults, and interstitial impurities). These properties have made superconducting metallic glasses popular for testing theories of transition widths, e.g., Naugle et al's results that agree well with the AL theory (see [13]-[14]) Thus, the use of the AL theory to predict $\Delta T_c$'s is reasonable. Further, there is evidence of 2D effects in thin Cu—Ti films that may be examined.

In high-quality MGTES thin films held under low-bias and low-T, smaller $\Delta T_c$ could be realized; with logarithmic sensitivity scaling as $\alpha \approx [\Delta T_c]^{-1}$ and values approaching $\alpha \approx 10000$ possible. The impact of a larger logarithmic sensitivity $\alpha$ is immediate. The resolution of TES devices is given by Eqn. 1, shown again below (see ref. [3]).

$$\Delta E_{FWHM} = \sqrt{k_B T^2 C (1/\alpha) \sqrt{8n}} \qquad \text{Eqn. } -1$$

Compared to the SOA TES with $50<\alpha<200$, the resolution of embodiments of the invention may be improved by factors proportional to $1/\sqrt{\alpha}$, which could yield reductions of up to 250% in $\Delta E_{FWHM}$.

Similarly, MGTES device embodiments may exhibit near-theoretical noise-equivalent-power (NEP) values. This performance improvement may arise from the intrinsic factors described above, and also extrinsic factors. For example, thin metallic glass films tend to grow with very little residual stress compared to polycrystalline metal films (where the stresses can be quite large) (see [15]). The work by R. R. Hake further summarizes the universal trend of narrow $\Delta T_c$'s for metallic glasses, in almost bulk form, i.e., in melt-spun ribbon form (see [16] which reports work for binary transition-metal alloys based on zirconium (Zr)). Of particular note is a $Zr_{62}Co_{38}$ (At. %) specimen with $T_c=2.10$ K, and $\Delta T_c=4$ mK; which yields $\Delta T_c/T_c=1.91\times10^{-3}$.

In addition to the above, embodiments of the invention may utilize two early-transition-metal/late-transition-metal (ETM-LTM) alloy systems known to exhibit superconductive behavior below 1 K: 1) amorphous $Cu_{35}Ti_{65}$ (At. %), which has $T_c \sim 58$ mK; and 2) amorphous $Cu_{60}Zr_{40}$ may be used. Embodiments of the invention may use these alloy and near-neighbor compositions in the respective alloy systems (see refs. [18] and [19]).

Performance metrics for the base amorphous metal systems that may also be examined, i.e., $Cu_{1-x}Ti_x$ and $Cu_{1-x}Zr_x$ (At. %), are shown in Table 3 (see refs. [18] and [19]):

TABLE 3

Summary of superconducting properties in the $Zn_{1-x}Cu_{-x}$ and Cu—Ti alloy systems

| Alloy | $T_c$ (K) | $\rho$ ($\Omega$-cm) $\times 10^{-6}$ |
|---|---|---|
| $Cu_{35}Ti_{65}$ | 0.058 | — |
| $Cu_{50}Ti_{50}$ | — | 230 |
| $Cu_{60}Zr_{40}$ | 0.32 | 183 |

To estimate the performance of an MGTES device fabricated from an amorphous $Cu_{60}Zr_{40}$ film, the AL theory can be applied to calculate the superconductive transition width $\Delta T_c$. This information is provided in Table 4:

TABLE 4

Transition width in $Cu_{60}Zr_{40}$

| Cu-content (At. %) | $\rho$ ($\Omega$-m) | t (Å) | $T_C$ (K) | $R_\square$ ( ) | Calculated $\Delta T_C$ (K) |
|---|---|---|---|---|---|
| 60 | 183e-8 | 920 | 0.3 | 19.89 | 90.7e-6 |

The predicted superconductive transition width is $\Delta T_C=90.7$ μK. In MGTES device embodiments, $\Delta T_c$'s of this magnitude may provide large logarithmic sensitivity factors. This $\Delta T_C$ value yields the following conservative estimate for the logarithmic sensitivity factor $\alpha$, $$\alpha = \frac{d\log R(T)}{d\log T} \approx \left(\frac{T_c}{R}\right)\left[\frac{\Delta R}{\Delta T_c}\right] \approx 3333$$

This number is much greater than the value for the SOA proximity effect TES device. In calculating $\alpha$, $\Delta R/R \approx 1$ is assumed. It may be recognized that an $\alpha$ of this magnitude is not realized when biasing a TES device in the ETF mode but, one can expect that the large value intrinsic to superconducting amorphous films may enable lower biasing points or a reduced noise equivalent power value.

Accordingly, embodiments of the invention may synthesize single-layer superconducting amorphous alloy films from the new class of multicomponent bulk metallic glass forming alloys, which exhibit a greater resistance to crystallization, and a higher glass-forming-ability (GFA). There are a number of reports of superconductive behavior for these alloys at temperatures below 1 K. Therefore, ternary, quaternary, and higher order alloying additions may be added to the binary alloys to tune the $T_C$ value and examine the effect of alloying on the MGTES device performance.

In view of the above, the single-layer superconducting amorphous metal alloy used in embodiments of the invention may consist of an early-transition-metal/late-transition-metal (ETM/LTM) alloy system that exhibits superconductive behavior. The early transition metal (ETM) elements may be drawn from elements in Groups IVB, VB, and VIIB of the periodic table, and the late-transition (LTM) metal elements may be drawn from elements in groups VIIIB, IB, and IIB of the periodic table. Such alloys may be deposited onto a substrate using sputtering, atomic-layer-deposition, electron-beam evaporation, or thermal evaporation.

MGTES Architecture for X-Ray and IR Radiation Detection

Figure 6:
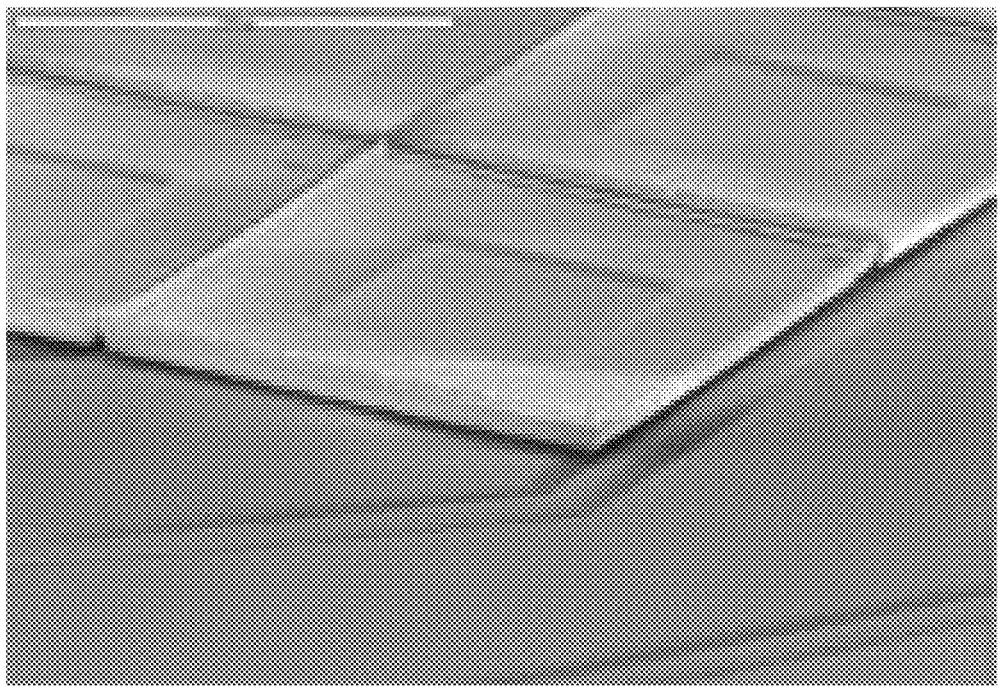
FIG. 6 illustrates a mushroom-type absorber structure in accordance with one or more embodiments of the invention.

As an efficient X-ray absorber, a modified laminated high fill-fraction array of Bi absorber structures may be employed, similar to that employed by Chervenak et al (e.g., the laminated Bi/Cu absorbers) (see ref [17]). This absorber consists of 8 total alternating individual Bi/Cu films, with layer thicknesses of 8.5 and 0.8 μm, respectively. This mushroom-type absorber structure is shown in FIG. 6 in accordance with one or more embodiments of the invention.

However, to improve the x-ray efficiency, a more efficient design may be adopted (e.g., a reduced Bi-thickness to increase intra-layer x-ray photon thermalization, coupled with an Au-interlayer instead of Cu). The electronic heat constant $\gamma_e$ for Cu and Au are similar, 0.695 and 0.729 mJ/mol-K$^2$, respectively. The higher Z of Au will improve the x-ray quantum efficiency. Measurements will be conducted to establish the heat capacity C. Depending on the superconducting metallic glass alloy used, MGTES device embodiments may utilize a self-absorbing MGTES superconducting thermistor element, using alloys selected from the Mo—Re, Mo—Ru, Zr—Rh, Cu—Sn, Pt—Zr, Pt—Ti, Hf—Ni, Hf—Cu, Hf—Pt, W—Cu, Ta—Cu, and similar superconducting alloys drawn from combination of 4d-3d transition metal alloys and 5d-3d transition metal alloys, and 5d-4d transition metal alloys, greatly simplifying the device design. Further, superconducting leads that connect the single-layer superconducting amorphous metal alloy to the circuit may be comprised of a different composition within the same alloy system as the superconducting amorphous metal alloys used as the thermistor element. For example, the superconducting leads may be made using $Zr_{76}Cu_{24}$ (At. %) with $T_C$=3.5 K; and the MGTES element (Thermistor) may be made using $Zr_{40}Cu_{60}$ (At. %) with $T_C$=0.32 K.

MGTES Device Exemplary Embodiments

Figure 7:
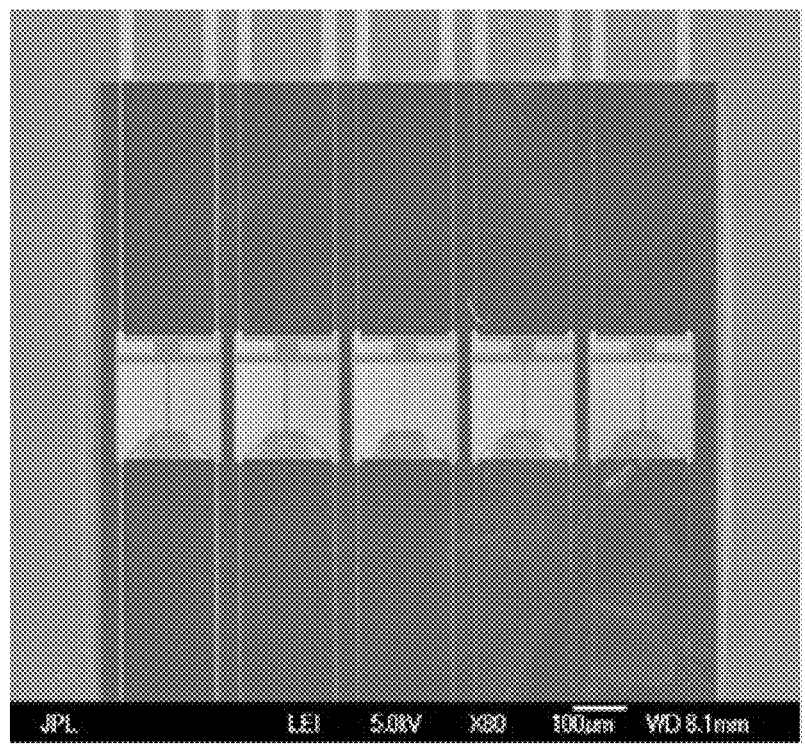
FIG. 7 illustrates four TES sensors on a SiN thermally isolated island structure in accordance with one or more embodiments of the invention.
Figure 8:
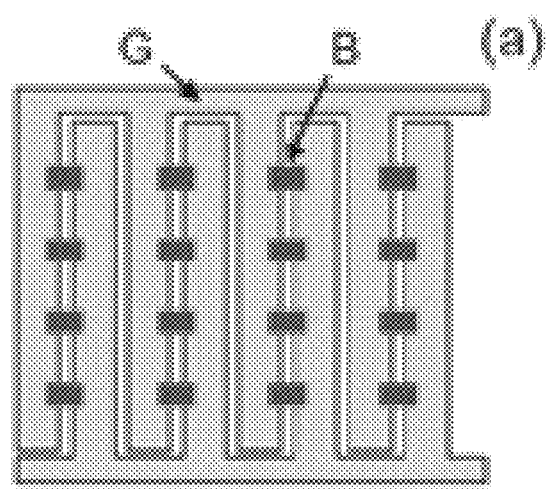
FIG. 8 illustrates distributed antenna-coupled small-volume arrays in accordance with one or more embodiments of the invention.

MGTES detectors may be designed for measurements conducted on a platform that operates at low temperatures (≈50 mK). Each MGTES device may be run in the deep Electrothermal Feedback (ETF) mode, and the noise characteristics of our sensors may be tested as described by Irwin et al. [1]-[3]. Depending on the alloy system under investigation and characteristics of the amorphous alloys prepared, the noise performance on thermally isolated island structures or small volume isolation architectures may be investigated. Examples of both structure types are shown in FIG. 7 and FIG. 8. In this regard, FIG. 7 illustrates four TES sensors on a SiN thermally isolated island structure in accordance with one or more embodiments of the invention. FIG. 8 illustrates distributed antenna-coupled small-volume e arrays in accordance with one or more embodiments of the invention. The left side of FIG. 8 illustrates a meandering aluminum structure (G) that forms an array of slot antennas. The two sides can be connected periodically with an array of MGTES microbolometers (B), each with a normal state resistance of tens of ohms (see ref [10]).

Conclusion

This concludes the description of the preferred embodiment of the invention. The following describes some alternative embodiments for accomplishing the present invention.

In view of the above, alloys used in MGTES device embodiments have significantly higher superconducting transition temperatures than the SOA TES devices based on thin films of Ti ($T_c$~0.5 K), or multi-layer MoAu designs that exploit the superconducting proximity effect ($T_c$~0.1 K). The complicated SOA TES device design requires a complex fabrication process; making it difficult to produce large arrays with uniform performance. The unexplained excess noise equivalent power (NEP) spectrum values observed in SOA TES systems (noise excess high-frequency noise, 4× over theoretical expectations) is introduced in part by the complicated multi-layer design and other factors intrinsic to the SOA TES design. SOA TES operating temperatures in the range T~100 mK require complex cryogenic cooling systems; e.g., a continuous adiabatic demagnetization refrigerator (ADR with 4-stages) or a $He^3/He^4$ dilution refrigerator. ADR systems for operation for T<1 K are very expensive, and in the early stages of development.

The superconducting transition temperature for some MGTES alloy films are $T_c$>4 K. Temperatures in this range, enable the use of cheaper, cryogen free cooling systems; e.g., pulse-tube-refrigerator (PTR) systems that are commercially available for the T<70K and T~4K temperature ranges. These systems do not vibrate like traditional Stirling or Gifford-McMahon cryocoolers. Another advantage of the MGTES concept is that the superconducting transition temperature is controlled by alloy composition alone, and not film thickness like in SOA TES systems. This affords a greater control over the $T_c$ and a more robust, reliable detector. The width of the superconducting transition region in superconducting metallic glasses, $\Delta T_c$, is significantly less than in crystalline alloys. The unexplained excess noise equivalent power (NEP) spectrum values observed in SOA TES systems (noise excess ~5-10% over theoretical expectations), will be reduced in MGTES systems due to: 1) the simpler device design (single thin film); 2) the intrinsically high electrical resistivity (yields RRR ~1); and 3) the intrinsically narrow superconducting transition region in superconducting metallic glasses, $\Delta T_c$, which provides an increased energy resolution, provided by correspondingly larger logarithmic sensitivity factors $\alpha$=d log R(T)/d log T≈[$T_c/\Delta T_c$]=3000 are possible. Compared to $\alpha \leq 100$ in SOA TES designs.

As described herein, embodiments of the invention provide the ability to use the MGTES detector in cryogenically cooled x-ray microcalorimeter detector arrays, for terrestrial applications. In this regard, a MGTES microcalorimeter array may establish a new paradigm as x-ray detectors for energy dispersive spectroscopy (EDS) systems in scanning electron microscopes. The MGTES device embodiments offer order of magnitude or better increase in energy resolution, i.e., decreased $\Delta E$, compared to SOA TES or Si-drift detectors, $\Delta E$~10 eV vs. $\Delta E$~200 eV. Other applications include: 1) x-ray detectors for medical systems; and 2) MGTES microcalorimeters as radioactive α-particle or γ-ray detectors for Nuclear Forensics applications.

In view of the above, the MGTES sensors of embodiments of the invention are a break-though superconducting transition-edge sensor with unprecedented performance. In particular, MGTES sensors may achieve the following improvements over that of the prior art:

develop superconducting amorphous metal alloys, with tunable $T_C$ for application to MGTES sensors;

MGTES sensors that take full advantage of the intrinsic fluctuation limits in amorphous superconductors; and MGTES array resulting in enhanced energy resolution and reduced noise floor.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

REFERENCES

[1] K. D. Irwin, "*An application of electrothermal feedback for high resolution cryogenic particle detection*" Appl. Phys. Lett. 66. 1998 (1995).

[2] S.-F. Lee, J. M. Gildemeister, W. H. Holmes, P. L. Richards, "*Voltage biased superconducting transition-edge bolometer with strong electrothermal feedback operated at 370 mK*" Appl Opt. 37, 3391 (1998).

[3] M. A. Lindeman, S. Bandler, R. P. Brekosky, J. A. Chervenak, E. Figueroa-Feliciano, F. M. Finkbeiner, R. L. Kelley, T. Saab, C. K. Stahle, D. J. Talley, "*Performance of compact TES arrays with integrated high-fill fraction X-ray absorbers*", Nuc. Instr. and Meth. A 520, 411 (2004).

[4] M. A. Lindeman, S. Bandler, R. P. Brekosky, J. A. Chervenak, E. Figueroa-Feliciano, F. M. Finkbeiner, T. Saab, and C. K. Stahle, "*Characterization and reduction of noise in Mo/Au transition edge sensors*", Nuc. Instr. and Meth. A 520, 348 (2004).

[5] J. N. Ullom, W. B. Doriese, G. X C. Hilton, J. A. Beall, S. Deiker, K. D. Irwin, C. D. Reintsema, L. R. Vale, and Y. Xu, "Suppression of excess noise in Transition-Edge Sensors using magnetic field and geometry", Nuc. Instr. and Meth. A 520, 333 (2004).

[6] W. L. Johnson and C. C. Tsuei, "Effect of thermodynamic fluctuations on the shape and width of the resistive transition in three-dimensional amorphous superconducting alloys" Phys. Rev B 13, 4827 (1976).

[7] W. L. Johnson, C. C. Tsuei and P. Chaudhari, "Paraconductivity of three-dimensional amorphous superconductors-evidence for a short-wavelength cutoff in the fluctuation spectrum" Phys. Rev B 17, 2884 (1978).

[8] K. Samwer and H. v. Löhneysen, "Amorphous superconducting $Zr_xCu_{1-x}$: Electronic properties, stability, and low-energy excitations", Phys. Rev. B 26, 107 (1982).

[9] V. Sushkov, "TES microcalorimeter readout via transformer", Nuc. Instr. and Methods in Physics Research A Vol. 530, 234-250 (2004).

[10] L. G. Aslamozov and A. I. Larkin, Phys. Letters 26A, 238 (1968).

[11] M. Tenhover and W. L. Johnson, "Superconductivity and the electronic structure of Zr-and Hf-based metallic glasses" Phys. Rev. B 27, 1610 (1982).

[12] J. H. Mooij, "Electrical-Conduction In Concentrated Disordered Transition-Metal Alloys" Phys. Status Solidi A 17, 521 (1973).

[13] D. G. Naugle and R. E. Glover, Thickness Dependence of the Resistive Transition of Superconducting Films, Phys. Lett. 28A, 110-111 (1968).

[14] D. G. Naugle and R. E. Glover, Size Dependence of the Superconducting Transition Temperature, Phys. Lett. 28A, 611-612 (1969).

[15] H. J. Bauer and W. Buckel, Zeitschrift Fur Physik 220, 293(1969).

[16] M. G. Karkut and R. R. Hake, "Upper critical fields and superconducting transition temperatures of some zirconium-base amorphous transition-metal alloys", Phys. Rev. B 28, 1396 (1983).

[17] J. A. Chervenak, F. M. Finkbeiner, T. R. Stevenson, D. J. Talley, R. P. Brekosy, E. Figueroa-Feliciano, M. A. Lindeman, R. L. Kelly, T. Saab, and C. K. Stahle, "Fabrication of transition edge sensor X-ray microcalorimeters for Constellation-X", Nuc. Instr. and Meth. A 520, 460 (2004).

[18] M. A. Howson and D. Grieg, "Localisation and interaction effects in the temperature and magnetic field dependence of the resistivity of metallic glasses", J. Phys. F: Met. Phys. 16, 989 (1986).

[19] Z. Altounian and J. O. Strom-Olsen, "Superconductivity and spin fluctuations in the M-Zr metallic glasses", Phys. Rev. B 27, 4149 (1983).

[20] M. A. Howson and B. L. Gallagher, "The electron transport properties of metallic glasses", Phys. Reports 170, 265 (1988).

[21] U. Mizutani, "Electronic structure of metallic glasses", Prog. Mat. Sci. 28, 97 (1983).

[22] D. G. Naugle, Electron Transport in Amorphous Metals, J. Phys. and Chem. of Solids 45, 367-388 (1984).

What is claimed is:

1. A method for fabricating a superconducting metallic glass transition-edge-sensor (MGTES), comprising:
depositing a single-layer superconducting amorphous metal alloy on a substrate, wherein the single-layer superconducting amorphous metal alloy is an absorber for the MGTES and is electrically connected to a circuit configured for readout and biasing to sense electromagnetic radiation.

2. The method of claim 1 wherein the substrate comprises a low-stress-silicon-nitride (LSN) substrate of varying thickness.

3. The method of claim 1 wherein the MGTES is deposited onto the substrate held at or near room temperature.

4. The method of claim 1 wherein the MGTES is deposited onto the substrate held between 77-300 K.

5. The method of claim 1 further comprising:
tuning a thermal conductance of the MGTES using a membrane-isolation method to support the MGTES.

6. The method of claim 1 further comprising:
depositing superconducting leads of the MGTES onto the single-layer superconducting amorphous metal alloy to electrically connect to the circuit, wherein the superconducting leads are comprised of superconducting amorphous metal alloys comprised of a same alloy system as the single-layer superconducting amorphous metal alloy, but with chemical compositions chosen such that the same alloy system exhibits a higher superconducting transition temperature, $T_C$.

7. The method of claim 1, further comprising:
reading out, using the circuit, one or more pixels from the MGTES using superconducting quantum interference (SQUID) amplifiers.

8. The method of claim 7, wherein the biasing uses an output of the SQUID current readout in feedback to apply a bias voltage to the single-layer superconducting amorphous metal alloy to maintain an operating point on a transition curve of the MGTES.

9. The method of claim 1 wherein the MGTES is operated in a temperature range that is achieved using a closed-cycle cryogenic system that uses $^3$He.

10. The method of claim 1 further comprising formatting the MGTES into an array having $10^3$ or more pixels.

11. The method of claim 1 further comprising changing a chemical composition of the single-layer superconducting amorphous metal alloy to control a $T_c$ of the MGTES.

12. The method of claim 1, wherein:
the single-layer superconducting amorphous metal alloy comprises an early-transition-metal/late-transition-metal (ETM/LTM) alloy system that exhibits superconductive behavior; and
the early transition metal (ETM) elements are drawn from elements in Groups IVB, VB, and VIIB of the periodic table, and the late-transition (LTM) metal elements are drawn from elements in groups VIIIB, IB, and IIB of the periodic table.

13. The method of claim 1, wherein the depositing comprises:
depositing a first metal onto the substrate; and
depositing a second metal onto the substrate;
wherein the first metal and the second metal are deposited under conditions to obtain the single-layer superconducting amorphous metal alloy using a method of sputtering, atomic-layer-deposition, electron-beam evaporation, or thermal evaporation.

14. The method of claim 1, wherein:
the absorber comprises a modified laminated high fill-fraction array of Bi absorber structures;
the absorber comprises alternating individual Bi/Au films; and
a layer thickness of the Bi film increases intra-layer x-ray photon thermalization.

15. A superconducting metallic glass transition-edge sensor (MGTES) comprising:
a circuit configured for readout and biasing to sense electromagnetic radiation; and an absorber, for the MGTES, that is electronically connected to the circuit, wherein the absorber comprises a single-layer superconducting amorphous metal alloy.

16. The superconducting metallic glass transition-edge sensor of claim 15, wherein a thermal conductance of the MGTES is tuned using a membrane-isolation type method to support the MGTES.

17. The superconducting metallic glass transition-edge sensor of claim 15 further comprising:
   superconducting leads that connect the single-layer superconducting amorphous metal alloy to the circuit, wherein the superconducting leads are comprised of a different composition within a same alloy system as the superconducting amorphous metal alloys used as a thermistor element.

18. The superconducting metallic glass transition-edge sensor of claim 15, further comprising:
   a superconducting quantum interference (SQUID) amplifier that is used to read out, using the circuit, one or more pixels from the MGTES.

19. The superconducting metallic glass transition-edge sensor of claim 18, wherein an output of the SQUID current readout in feedback is used to apply a bias voltage to the single-layer superconducting amorphous metal alloy to maintain an operating point on a transition curve of the MGTES.

20. The superconducting metallic glass transition-edge sensor of claim 15 wherein the MGTES is operated in a temperature range that is achieved using a closed-cycle cryogenic system that uses $^3$He, a continuous adiabatic demagnetization refrigerator (ADR with 4-stages), a He$^3$/He$^4$ dilution refrigerator, or a cryogenic cooling system that uses liquid $^4$He.

21. The superconducting metallic glass transition-edge sensor of claim 15 wherein the MGTES is formatted into an array having $10^3$ or more pixels.

22. The superconducting metallic glass transition-edge sensor of claim 15 wherein a chemical composition of the single-layer superconducting amorphous metal alloy is changed to control a $T_c$ of the MGTES.

23. The superconducting metallic glass transition-edge sensor of claim 15, wherein:
   the single-layer superconducting amorphous metal alloy comprises an early-transition-metal/late-transition (ETM/LTM) metal alloy system that exhibits superconductive behavior; and
   the early transition metal (ETM) elements are drawn from elements in Groups IVB, VB, and VIIB of the periodic table, and the late-transition (LTM) metal elements are drawn from elements in groups VIIIB, IB, and IIB of the periodic table.

* * * * *